United States Patent [19]
Mojaradi et al.

[11] Patent Number: 5,541,439
[45] Date of Patent: Jul. 30, 1996

[54] LAYOUT FOR A HIGH VOLTAGE DARLINGTON PAIR

[75] Inventors: Mohamad M. Mojaradi, Los Angeles; Guillermo Lao, Torrance; Steven A. Buhler, Redondo Beach; Tuan A. Vo, Hawthorne, all of Calif.

[73] Assignee: Xerox Corporation, Stamford, Conn.

[21] Appl. No.: 341,250

[22] Filed: Nov. 17, 1994

[51] Int. Cl.$^6$ .......................... H01L 23/58; H01L 27/082
[52] U.S. Cl. .......................... 257/488; 257/489; 257/491; 257/567
[58] Field of Search .................. 257/567, 566, 257/568, 570, 571, 572, 488, 489, 490, 491

[56] References Cited

U.S. PATENT DOCUMENTS

| | | | |
|---|---|---|---|
| 3,221,215 | 11/1965 | Osafune et al. .................. | 257/567 |
| 3,751,726 | 8/1973 | Einthoven et al. .................. | 317/235 |
| 3,836,996 | 9/1974 | Schilp et al. .................. | 357/46 |
| 4,924,286 | 5/1990 | Ishibashi .................. | 357/46 |

FOREIGN PATENT DOCUMENTS 60150674  8/1985  Japan .................. 257/494

Primary Examiner—Steven H. Loke
Attorney, Agent, or Firm—Fariba Rad

[57] ABSTRACT

There is disclosed a layout of a high voltage Darlington pair in which a circular field plate is utilized for both high voltage transistors in order to reduce the layout area. In this layout, both transistors of a Darlington pair are circular transistors and they both have a common center. This enables both high voltage transistors to share one field plate ring and one collector ring.

34 Claims, 9 Drawing Sheets

LAYOUT FOR A HIGH VOLTAGE DARLINGTON PAIR

BACKGROUND OF THE INVENTION

This invention relates to a layout of an integrated high voltage Darlington pair and, more particularly, to a layout which reduces the large layout area of a conventional high voltage Darlington pair.

In order to comprehend this invention it is necessary to study the circuit and the layout of high voltage transistors.

Referring to FIG. 1, there is shown an example of a circuit diagram of a high voltage transistor Q. The emitter 10 is connected to a high voltage+V the collector 12 is grounded and the base 14 is connected to an input Vin. The input Vin has a voltage which is close to the voltage of the emitter 10.

In high voltage applications, the transistors are designed to withstand high voltages as high as 1000 volts by constructing a field plate between the base and the collector of each transistor. The field plate spaces out the field lines to avoid field concentrations. The field plate also acts as a resistance shown by R.

Referring to FIG. 2, there is shown a cross sectional view of the layout 20 of the transistor Q of FIG. 1 on a p-type substrate 22. The bipolar transistor comprises a n-type well or tub 24, a p+region 10 within the n-well 24 to function as the emitter 10 of the transistor Q. A n+region 14 within the n-well 24 provides a contact for the n-well 24. The n-well 24 functions as the base of the transistor Q and the n+ region 14 is the contact of the base. A p+region 12 outside of the n-well 24 is the collector of the transistor Q. In order to have a high voltage transistor, the p+region 12 has to be separated from the n-well 24 (base) by a layer of field oxide 26 which accommodates an area for the field plate rings 28 and a field plate resistor 30. Under the field oxide, there is a layer of n—region 25 which is the drift region for the n-well 24. The n—region 25 increases the breakdown voltage of the transistor. The reason for having two n+regions 14, two p+regions 12 (collector) and two field oxide 26 regions is that the layout is circular.

Referring to FIG. 3 there is shown a top view of the layout of the high voltage transistor of FIGS. 1 and 2. Typically the transistors are made to be circular and therefore, the n-well 24 (base) and the emitter 10 will be located at the center and collector 12 will be a circular ring separated from the n-well 24 (base) by a large ring of field oxide 26 which accommodates an area for several field plate rings 28 and the field plate resistor 30. Field plate has to be overlaid on a layer of field oxide since the field plate has to sustain a large amount of voltage.

The field plate comprises a plurality of field plate rings 28 over a layer of field oxide 26 and a field plate resistor 30. It should be noted that under the field oxide 26, there is a layer of n—region 25. Each ring 28 of the field plate distributes an equal voltage around the field plate area. The field plate resistor 30 which is connected to all the rings 28 is also connected to the base and the collector by metal bonding 29 and 31 respectively. Due to a plurality of rings 28 required to distribute the high voltage difference between the base and the collector, the area that the rings of the field plate and the field oxide under the field plate occupy is quite large. Therefore, the layout of a high voltage transistor is very large.

For the purpose of simplicity hereinafter, the combination of field oxide ring 26, the layer of n—region 25 under the field oxide 26, the field plate resistor 30 and the field plate rings 28 will be referred to as "field plate".

Referring to FIG. 4, there is shown an example of a circuit diagram of a Darlington pair. It is well known in the art that a Darlington pair 40 is a circuit comprising two bipolar transistors Q1 and Q2 in which the base 42 of transistor Q2 is connected to the emitter 44 of transistor Q1. Also, the collectors 46 and 48 of both transistors Q1 and Q2 are connected to a common voltage V1. The base 50 of transistor Q1 is connected to the input Vin and the emitter 52 of the transistor Q2 is connected to a high voltage $V_2$ which is more positive than $V_1$.

Referring to FIG. 5, there is shown a top view of the layout of the high voltage Darlington pair 40 of FIG. 4. In the layout of a high voltage Darlington pair, two high voltage transistors Q1 and Q2 are constructed next to each other. However, since each transistor has a large ring 26 dedicated to the field plate, the two transistors used for a Darlington pair occupy a very large area.

Due to the high cost of the integrated devices, a high voltage Darlington pair with a large layout area becomes cost prohibitive. It is an object of this invention to reduce the layout area needed for a high voltage Darlington pair.

SUMMARY OF THE INVENTION

In accordance with the present invention, the layout of two high voltage transistors used in a Darlington pair is modified in such a manner that both transistors share one common field plate and share one common collector.

DESCRIPTION OF THE PREFERRED EMBODIMENT

In this invention, the layout has been reduced by sharing one field plate for both transistors which in turn eliminates the need for the second ring plate. Also, since in a Darlington pair, the collectors of both transistors are connected to each other, one collector ring which is connected to the substrate can be used for both transistors and therefore the second collector ring can be eliminated.

Figure 1:
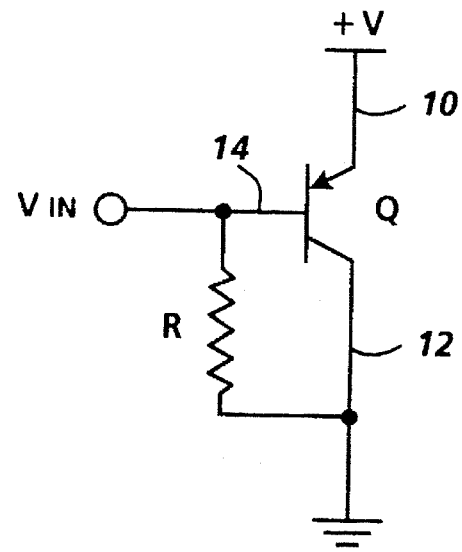
FIG. 1 shows a circuit diagram of a high voltage transistor.
Figure 4:
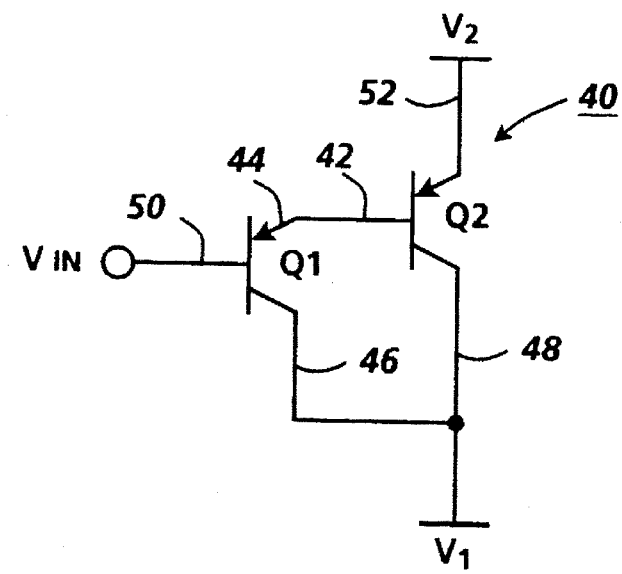
FIG. 4 shows a circuit diagram of a PNP Darlington pair.
Figure 2:
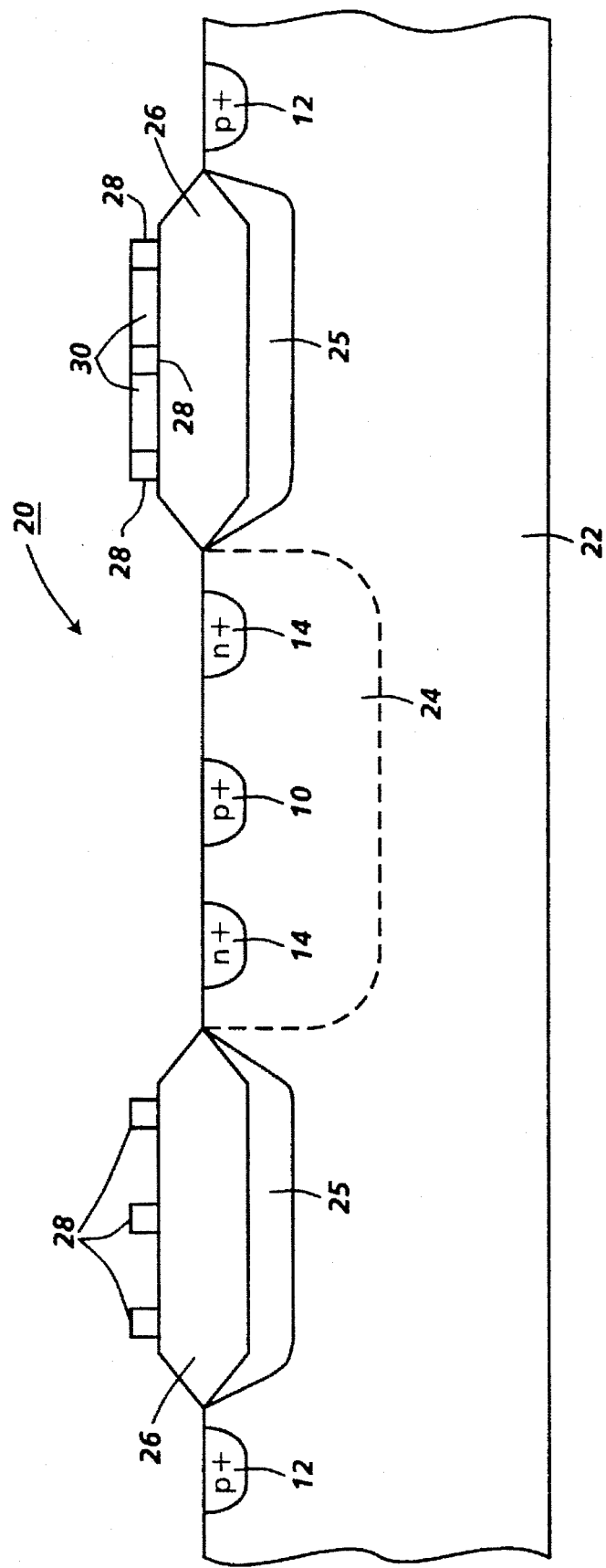
FIG. 2 Shows a cross sectional view of the layout of the transistor of FIG. 1 on a p-type substrate.
Figure 3:
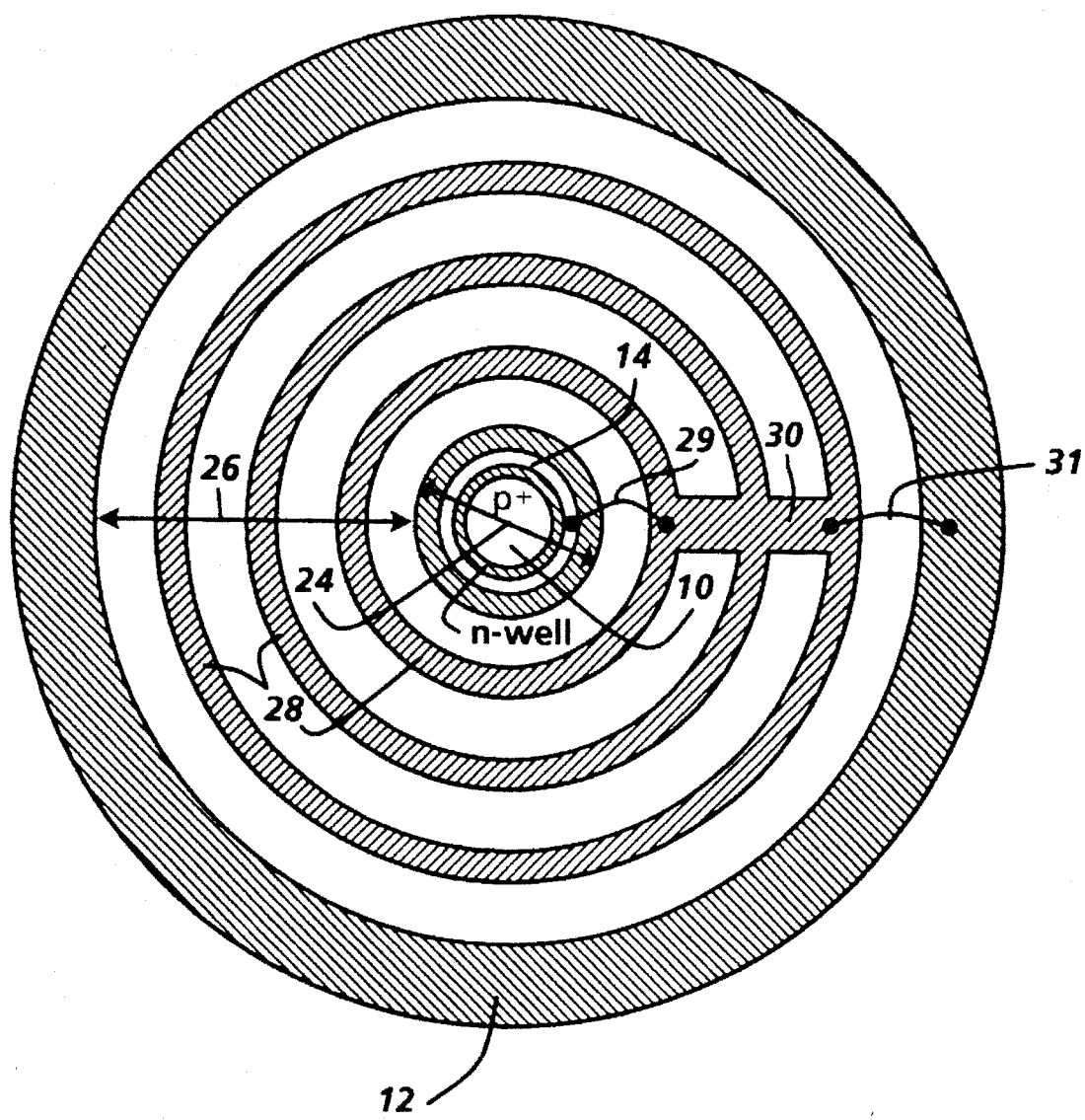
FIG. 3 shows a top view of the layout of the high voltage transistor of FIGS. 1 and 2.
Figure 5:
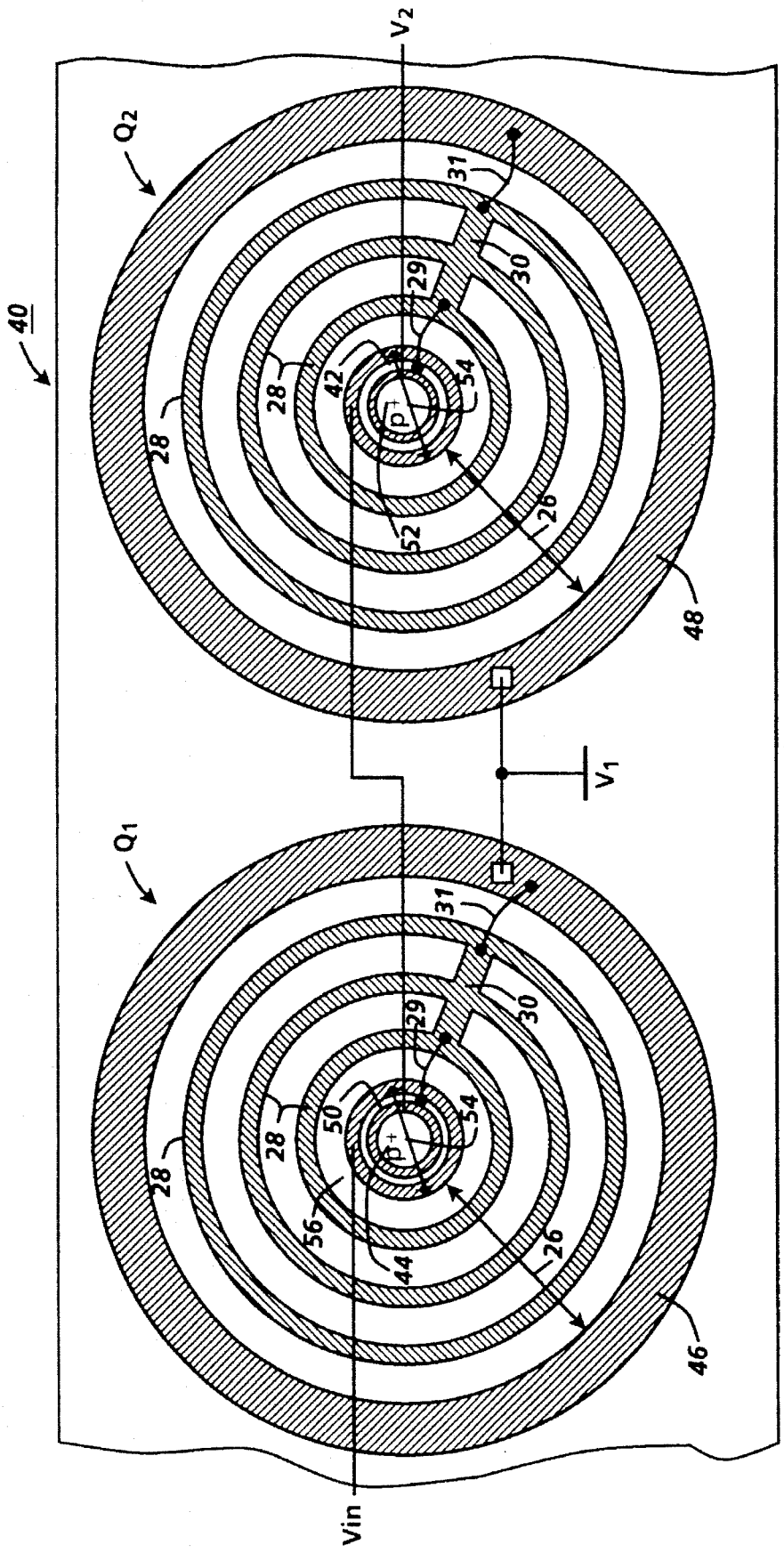
FIG. 5 shows a top view of the layout of the PNP high voltage Darlington pair of FIG. 4.
Figure 6:
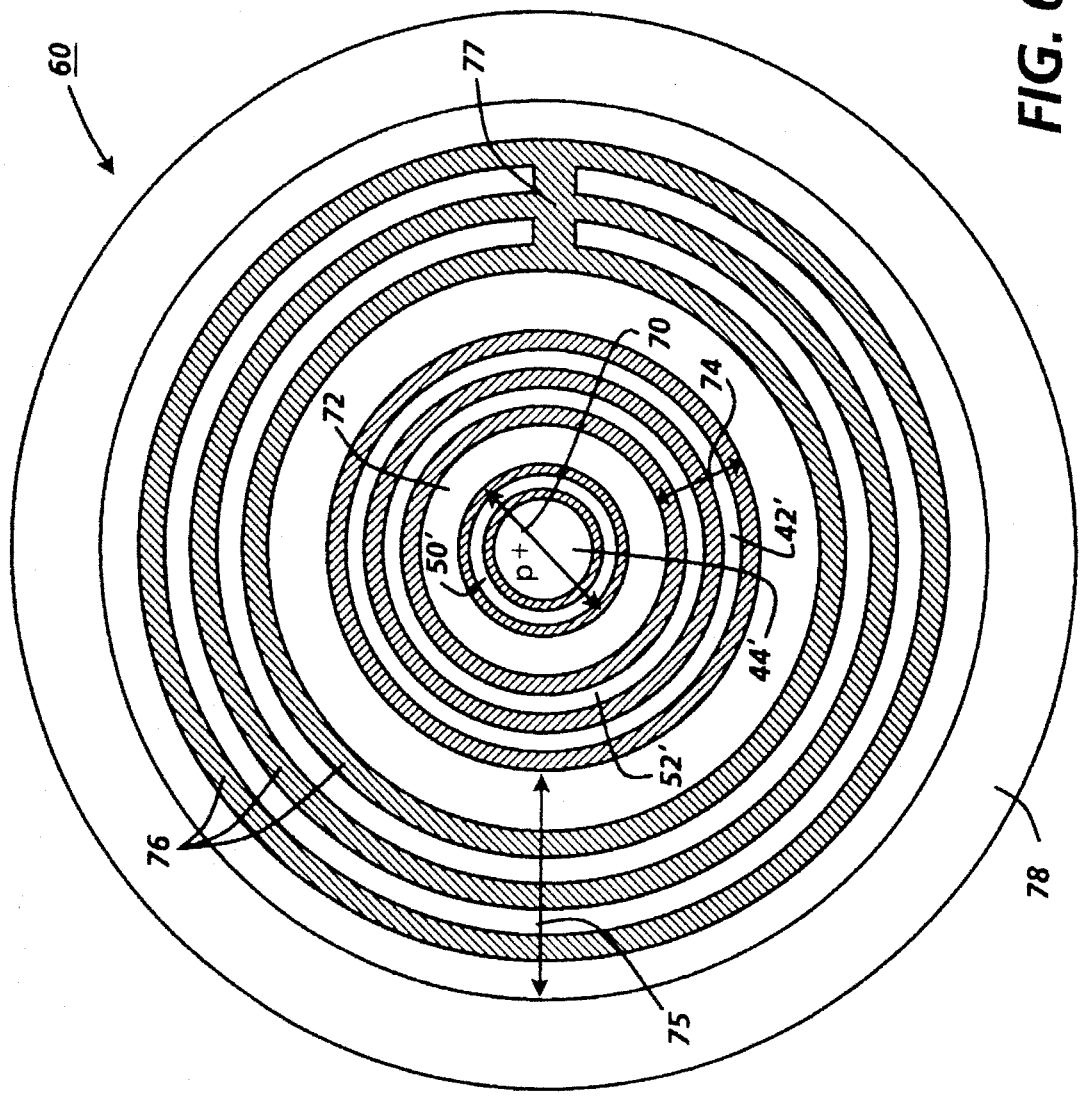
FIG. 6 shows a top view of the layout of the PNP high voltage Darlington pail of this invention.

Referring to FIG. 6, there is shown a top view of the layout 60 of a PNP high voltage Darlington pair of this invention. This layout contains two concentric transistors Q1 and Q2. It should be noted that the emitters, the bases and the collectors of the transistors Q1 and Q2 are designated by the same reference numerals as disclosed in the circuit diagram 40 of FIG. 4, only with a prime"'" affixed thereto.

The circular area shown by 70, is the n-well (the base) of the transistor Q 1 and the p+region 44', at the center of the n-well 70, is the emitter of the transistor Q1. A ring of n+region 50' within the n-well 70 is the contact of the n-well 70. In the enclosed embodiment of this invention, a ring of field oxide 72 isolates the center transistor Q1 from transistor Q2. However, it should be noted that the two transistors can be isolated from each other by other means such as an inactive CMOS transistor. The area shown by 74 is the n-well (the base) of transistor Q2 and the ring 52' within the n-well 74 is the emitter of the transistor Q2. A ring of n+region 42' within the n-well 74 is the contact of the n-well 74.

In this layout 60 both transistors share one common field plate. The common field plate provides the required field plate for both transistors Q1 and Q2. In the preferred embodiment of this invention, the field plate comprises a plurality of field plate rings 76 over a layer of field oxide 75, a layer of n—region (not shown) under the field oxide 75 and a field plate resistor 77 which is electrically connected to all of the field plate rings 76. It should be noted that the term "field plate" is well known in the industry and there are various kinds of field plates. It should also be noted that any field plate can replace the field plate disclosed in the preferred embodiment of this invention.

Also, ring 78, is the collector for both transistors Q1 and Q2. In this layout the collector 78 is connected to the substrate of the chip. In this configuration, the n-wells 70 and 74 of both transistors Q1 and Q2 are separated from their common collector 78 by a common field plate which enables both transistors Q1 and Q2 function under a high voltage.

Referring back to FIG. 4, transistor Q2 handles a higher current compared to transistor Q1. Transistor Q1 amplifies the current and supplies it to transistor Q2. Therefore, transistor Q2 has to be larger than transistor Q1 to be able to handle a larger current. Therefore, in the layout of the Darlington pair of this invention (FIG. 6), the center transistor is Q1 and the outer transistor, which is larger, is Q2.

Figure 7:
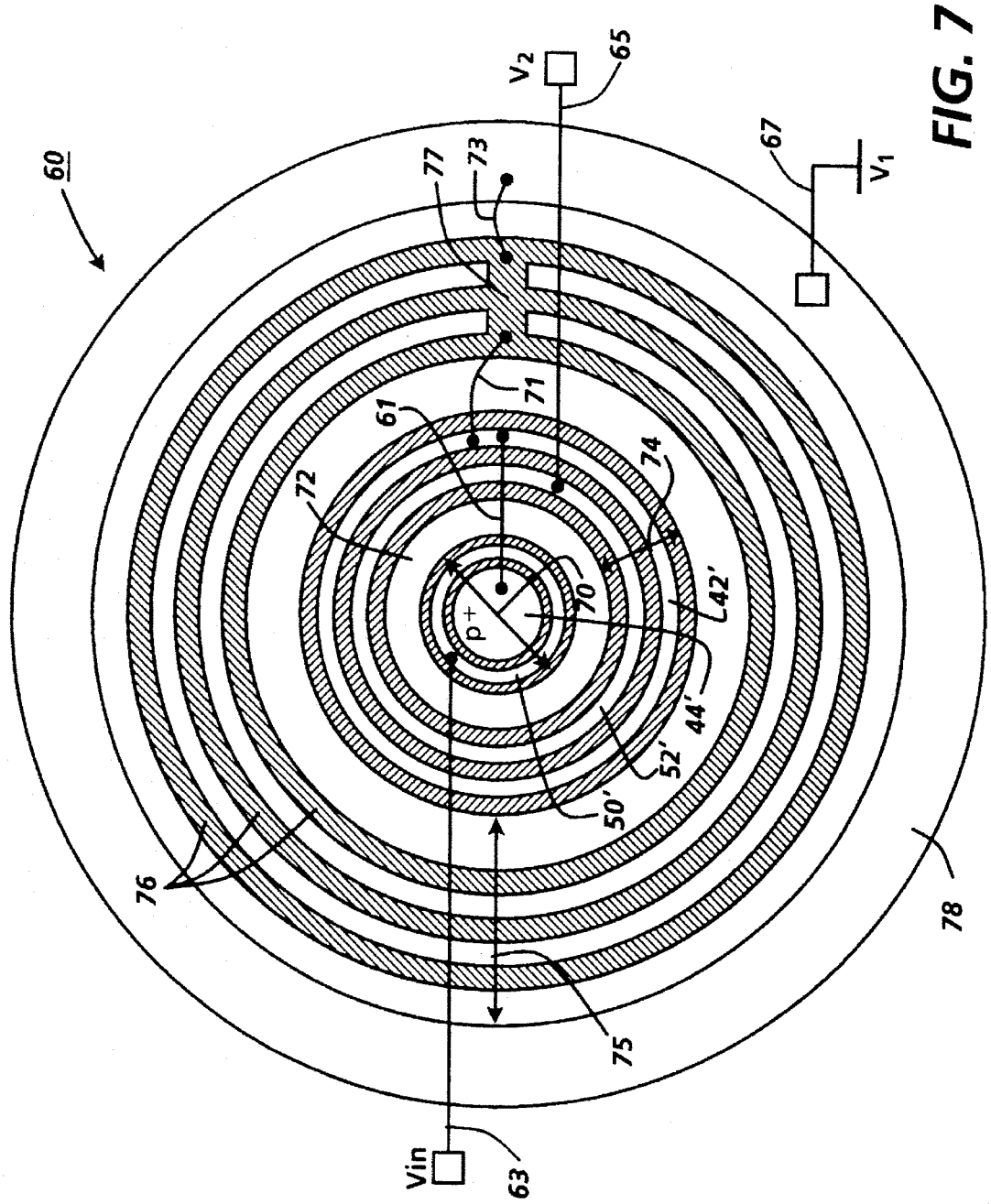
FIG. 7 shows the electrical connections of a PNP Darlington pair layout of this invention.

Referring to FIG. 7, there is shown the layout of the PNP high voltage Darlington pair of FIG. 6 with its electrical connections. In this configuration, emitter 44' of the transistor Q1 is connected to the base 74 (the n-well) of the transistor Q2 through the contact 42' of the n-well 74 by metal bonding 61. The field plate resistor 77 which is connected to the field plate rings 76 through the layout is also connected to the base of Q2 and the collector by metal bondings 71 and 73 respectively. The base 70 (the n-well) of the transistor Q1 is connected to the input $V_{in}$ through the contact 50' of the n-well 70 by metal bonding 63. The emitter 52' of the transistor Q2 is connected to the high voltage $V_2$ by metal bonding 65. The common collector 78 of both transistors is connected to $V_1$ by metal bonding 67.

$V_2$ is more positive than $V_1$ and there should be at least 1 volt difference between $V_1$ and $V_2$. Also, the difference between $V_1$ and $V_2$ should not exceed the absolute value of the breakdown voltage of the transistors. For example, in the preferred embodiment of this invention, the absolute value of the breakdown voltage of the transistors is 1500 volts. However, it should be noted that the absolute value of the breakdown voltage of the transistors is not limited to 1500 volts and depending on the design of the transistors, the absolute value of the breakdown voltage of the transistors can be lower or higher than 1500 volts. It should also be noted that $V_1$ can be a negative voltage, a positive voltage or ground.

The layout shown in FIGS. 6 and 7 are based on PNP high voltage Darlington pair. However, the concept of using a common field plate and a common collector can be used for a NPN high voltage Darlington pair.

Figure 8:
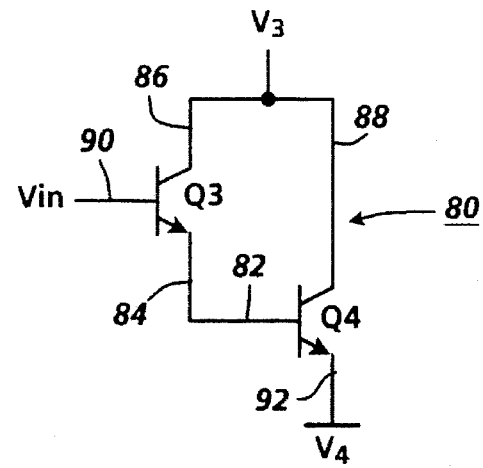
FIG. 8 shows a circuit diagram of a NPN Darlington pair.

Referring to FIG. 8, there is shown a circuit diagram 80 of a NPN high voltage Darlington pair. The Darlington pair 80 is a circuit comprising two bipolar transistors Q3 and Q4 in which the base 82 of transistor Q4 is connected to the emitter 84 of transistor Q3. Also, the collectors 86 and 88 of both transistors Q3 and Q4 are connected to each other and they are connected to voltage $V_3$. The base 90 of transistor Q3 is connected to the input Vin and the emitter 92 of the transistor Q4 is connected to a voltage $V_4$.

Figure 9:
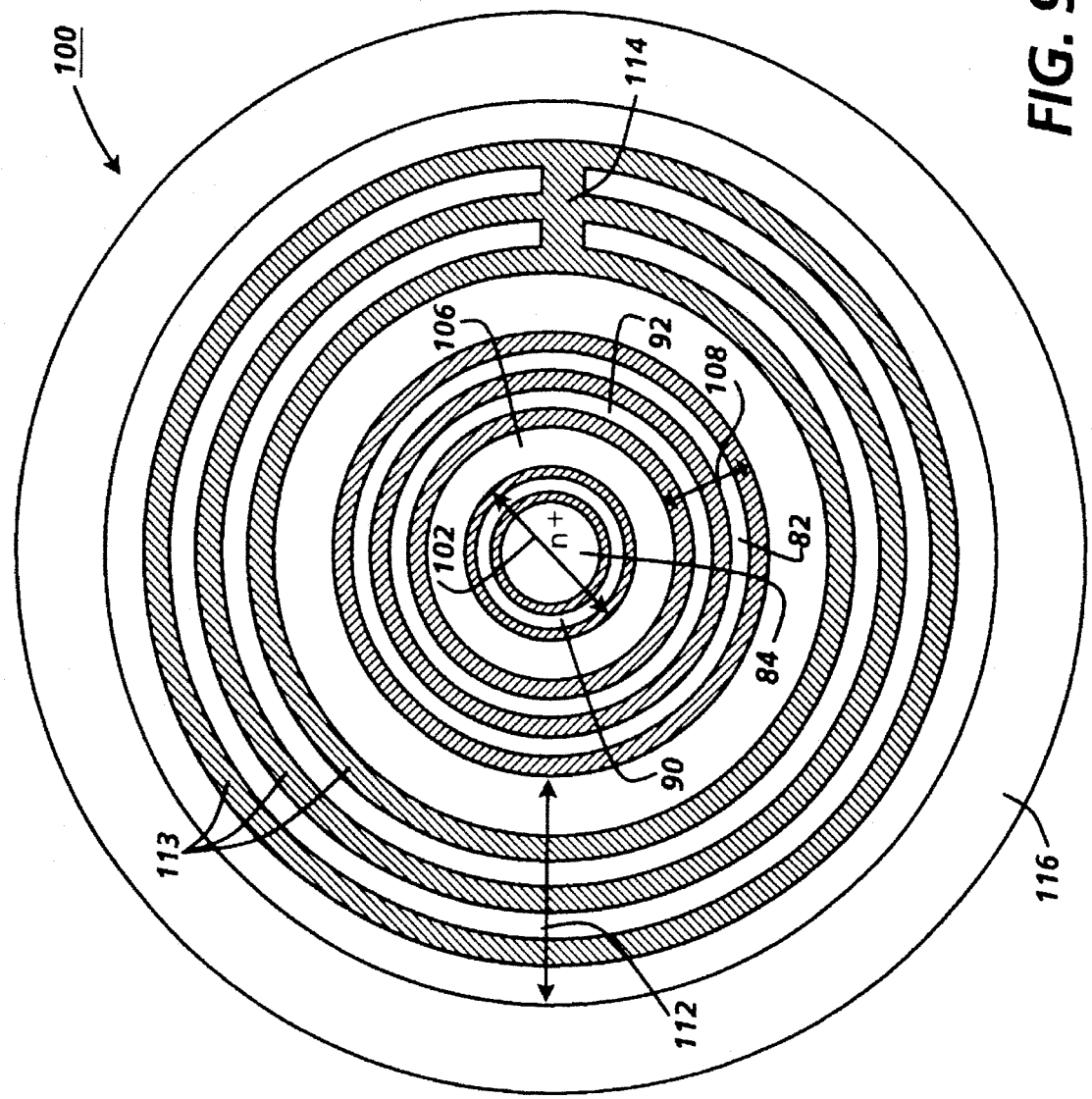
FIG. 9 shows a top view of the layout of a high voltage NPN Darlington pair of this invention.

Referring to FIG. 9, there is shown a top view of the layout structure 100 of the NPN high voltage Darlington pair of this invention. The circular area shown by 102, is the p-well (the base) of transistor Q3 (the center transistor) and the n+region 84, at the center of the p-well, is the emitter of transistor Q3. A ring of p+region 90 within the p-well 102 is the contact of the p-well 102. A ring of field oxide 106 isolates the center transistor Q3 from the outer transistor Q4. Ring 108 is the p-well (the base) of transistor Q4 and the ring of n+region 92 is the emitter of transistor Q4. A ring of p+region 82 within the p-well 108 is the contact of the p-well 108.

Both transistors share one common field plate. Field oxide 112, the n—region under the field oxide (not shown), field plate rings 113 and the field plate resistor 114 together provide the required field plate for both transistors Q3 and Q4. Also, ring 116, is the collector for both transistors. In this configuration, the p-wells 102 and 108 of both transistors are separated from their collector 116 by a ring of field plate which enables both transistors function under a high voltage.

Figure 10:
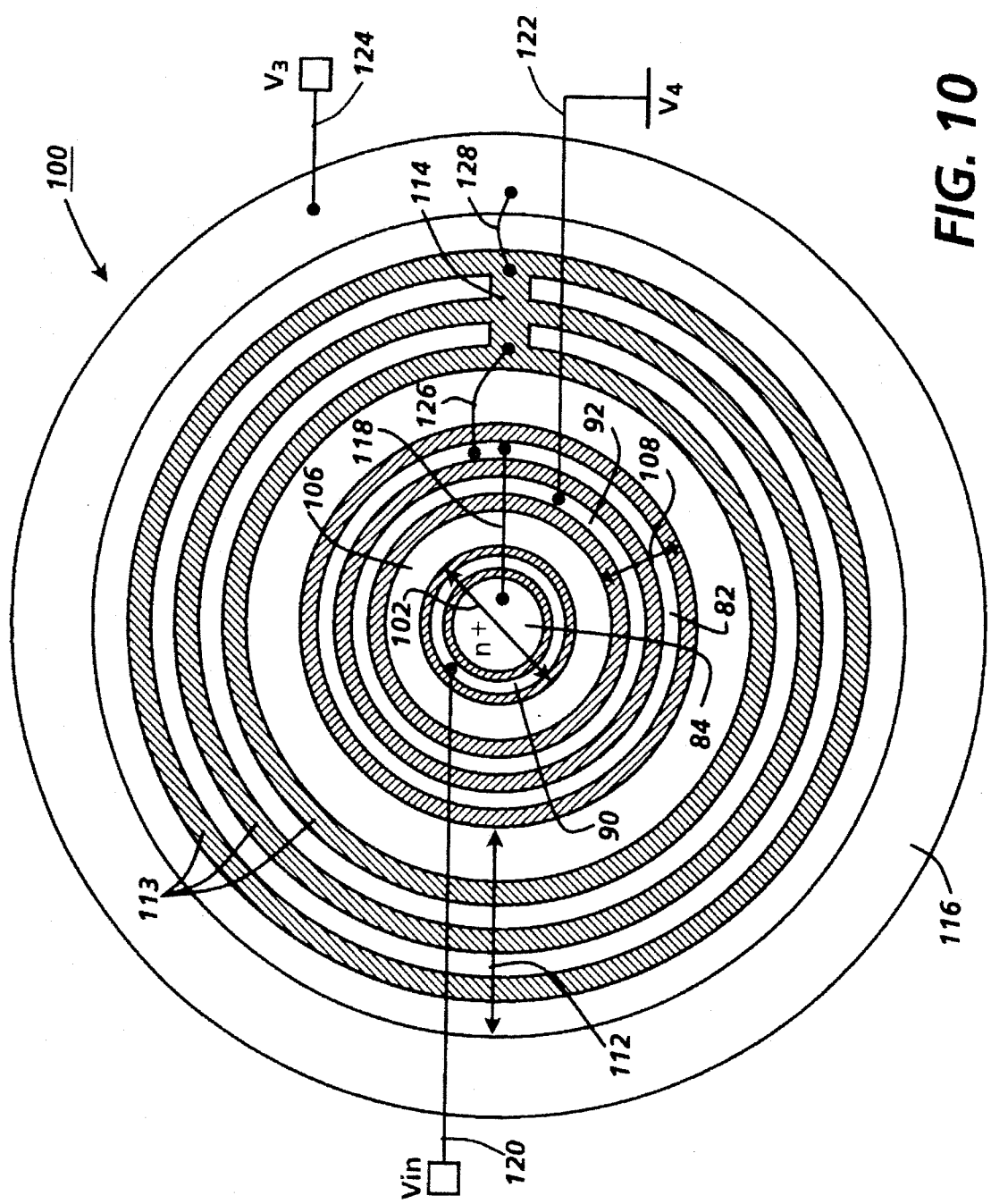
FIG. 10 shows the electrical connections of a NPN Darlington pair layout of this invention.

Referring to FIG. 10, there is shown a layout of a NPN high voltage Darlington pair with its electrical connections. In this configuration, emitter 84 of the transistor Q3 is connected to the base 108 (the p-well) of the transistor Q4 through the contact 82 of the p-well 108 by metal bonding 118. The base 102 (the p-well) of the transistor Q3 is connected to the input Vin through the contact 90 of the p-well 102 by metal bonding 120. The emitter 92 of the transistor Q4 is connected to a voltage $V_4$ by metal bonding 122. The common collector 116 of both transistors is connected to a voltage $V_3$ by metal bonding 124. Finally the field plate resistor 114 which is connected to the field plate rings 113 through the layout is also connected to the base of Q4 and the collector by metal bondings 126 and 128 respectively.

$V_4$ is more negative than $V_3$ and there should be at least 1 volt difference between $V_3$ and $V_4$. Also, the difference between $V_3$ and $V_4$ should not exceed the absolute value of the breakdown voltage of the transistors. It should also be noted that $V_3$ can be a negative voltage, a positive voltage or ground.

It should be noted that the electrical connections of the Darlington pair shown in the embodiment of this invention both for the PNP and NPN is only one possibility. The Darlington pair layout can have different electrical connections. The collector can be connected to a different circuit or it can be connected to a power supply. In the same manner, the emitter of the transistor Q2 or Q4 can be connected to a different circuit or it can be connected to a power supply. Also, it is not necessary to have the electrical connection of the collector from the surface of the wafer. It is possible to have the electrical connection of the collector from the back side of the wafer.

It should also be noted that in all the different electrical connections of the Darlington pair of this invention, the collector is also connected to the substrate of the chip.

It should yet be noted that this layout is not limited to a high voltage Darlington pair. This layout can be used for high voltage circuits in which the collectors of a plurality of transistors are connected to a common voltage. In this case, the layout of all the transistors will have one common center and one common field plate and one common collector.

It should further be noted that the transistors do not have to have circular shapes. The preferred embodiment of this invention disclose circular transistors. However, it is possible to have any shape transistor as long as one transistor encloses the other transistor and a field plate encloses both transistors and a collector encloses the field plate. In addition, the emitter (p+region within the n-well or n+region within the p-well) and the base contact (n+region within the n-well or p+region within the p-well) in each transistor do not have to be circular and they can have any shape and each can enclose the other or they can be apart from each other without enclosing each other.

Figure 11:
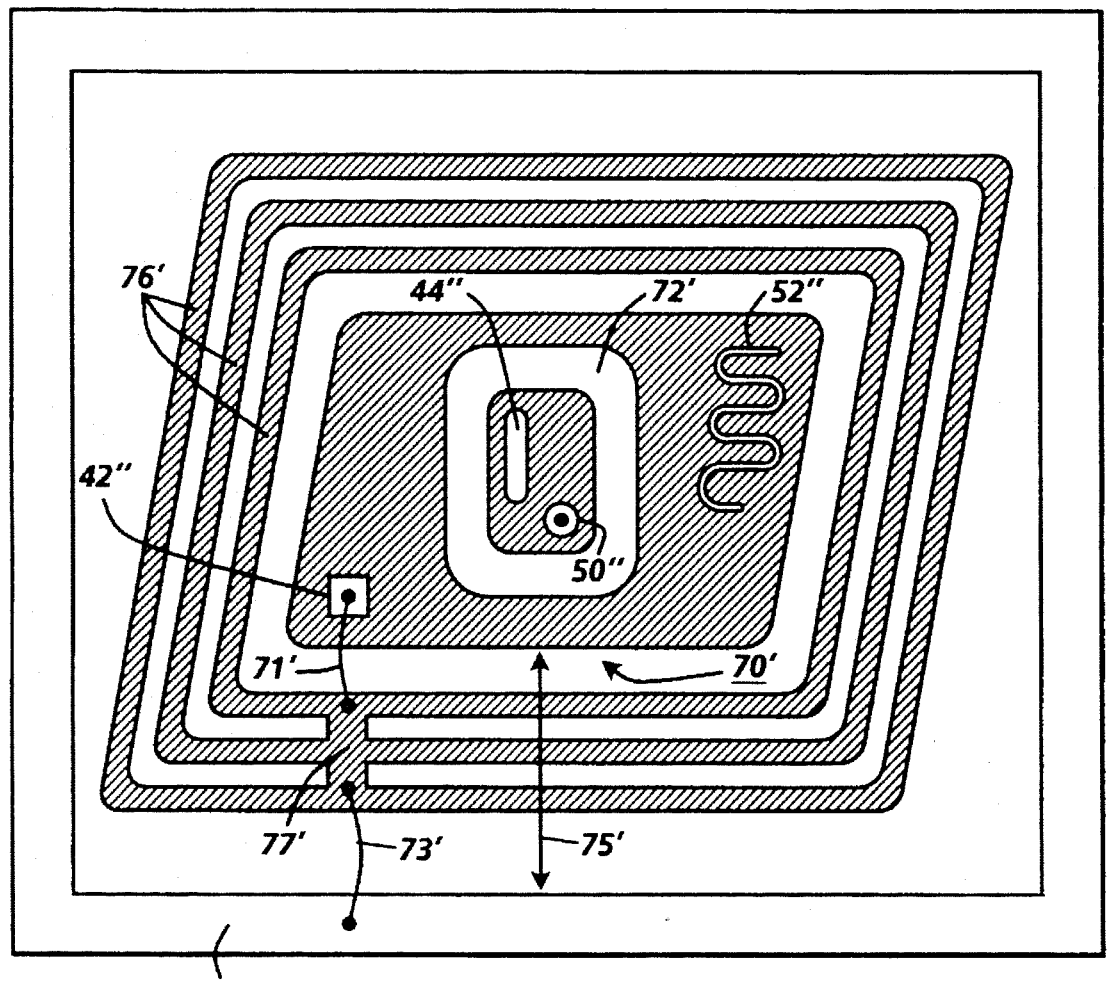
FIG. 11 shows an example of an alternative layout of a PNP Darlington pair of this invention.

There are infinite number of possibilities in the shapes of the transistors and the shapes of the emitters and the base contacts both for PNP and NPN high voltage Darlington pair layouts. Referring to FIG. 11, there is shown one example of a high voltage Darlington pair layout of this invention which is not circular. The layout of FIG. 11 is an alternative layout for the PNP Darlington pair layout of FIG. 6. In FIG. 11, those elements which are the same as disclosed in the description of FIG. 6 are designated by the same reference numerals, only with a prime "'" affixed thereto.

What is claimed is:

1. A layout of a high voltage integrated circuit device comprising:

a p-type substrate;

a first n-well region;

a first p+region wholly within said first n-well region;

a first n+region wholly within said first n-well region;

an isolating region surrounding said first n-well region;

a second n-well region surrounding said isolating region;

said isolating region isolating said first n-well region from said second n-well region;

a second p+region wholly within said second n-well region;

a second n+region wholly within said second n-well region;

a field plate region surrounding said second n-well region;

a third p+region surrounding said field plate region;

said first n-well, said first p+region, said first n+region and said third p+region forming a first high voltage transistor;

said second n-well, said second p+region, said second n+region and said third p+region forming a second high voltage transistor;

said third p+region forming a common collector for said first high voltage transistor and said second high voltage transistor; and said field plate region forming a common field plate for both said first high voltage transistor and said second high voltage transistor.

2. The layout of the high voltage integrated circuit device recited in claim 1 further comprising:

an input;

said first n+region being electrically connected to said input;

a first voltage;

said third p+region electrically being connected to said first voltage;

a second voltage;

said second p+region being connected to said second voltage;

said first p+region being electrically connected to said second n+region; and said second voltage being more positive than said first voltage.

3. The layout of the high voltage integrated circuit device recited in claim 2, wherein said first voltage is positive.

4. The layout of the high voltage integrated circuit device recited in claim 2, wherein said first voltage is negative.

5. The layout of the high voltage integrated circuit device recited in claim 2, wherein said first voltage is ground.

6. The layout of the high voltage integrated circuit device recited in claim 2, wherein said second voltage is at least 1 volt more than said first voltage.

7. The layout of the high voltage integrated circuit device recited in claim 6, wherein said first voltage is positive.

8. The layout of the high voltage integrated circuit device recited in claim 6, wherein said first voltage is negative.

9. The layout of the high voltage integrated circuit device recited in claim 6, wherein said first voltage is ground.

10. The layout of the high voltage integrated circuit device recited in claim 6, wherein said transistors having a breakdown voltage and the maximum difference between said first voltage and said second voltage is equal to the absolute value of the breakdown voltage of said transistors.

11. The layout of the high voltage integrated circuit device recited in claim 10, wherein said first voltage is positive.

12. The layout of the high voltage integrated circuit device recited in claim 10, wherein said first voltage is negative.

13. The layout of the high voltage integrated circuit device recited in claim 10, wherein said first voltage is ground.

14. The layout of the high voltage integrated circuit device recited in claim 2, wherein said transistors having a breakdown voltage and the maximum difference between said first voltage and said second voltage is equal to the absolute value of the breakdown voltage of said transistors.

15. The layout of the high voltage integrated circuit device recited in claim 14, wherein said first voltage is positive.

16. The layout of the high voltage integrated circuit device recited in claim 14, wherein said first voltage is negative.

17. The layout of the high voltage integrated circuit device recited in claim 14, wherein said first voltage is ground.

18. A layout of a high voltage integrated circuit device comprising:

a n-type substrate;

a first p-well region;

a first n+region wholly within said first p-well region;

a first p+region wholly within said first p-well region;

an isolating region surrounding said first p-well region;

a second p-well region surrounding said isolating region;

said isolating region isolating said first p-well region from said second p-well region;

a second n+region wholly within said second p-well region;

a second p+region wholly within said second p-well region;

a field plate region surrounding said second p-well region;

a third n+region surrounding said field plate region;

said first P-well, said first n+region, said first p+region and said third n + region forming a first high voltage transistor;

said second P-well, said second n+region, said second p+region and said third n+region forming a second high voltage transistor;

said third n+region forming a common collector for said first high voltage transistor and said second high voltage transistor; and said field plate region forming a common field plate for both said first high voltage transistor and said second high voltage transistor.

19. The layout of the high voltage integrated circuit device recited in claim 18 further comprising:

an input;

said first p+region being electrically connected to said input;

a first voltage;

said third n+region being electrically connected to said first voltage;

a second voltage;

said second n+region being connected to said second voltage;

said first n+region being electrically connected to said second p+region; and said second voltage being more negative than said first voltage.

20. The layout of the high voltage integrated circuit device recited in claim 19, wherein said first voltage is positive.

21. The layout of the high voltage integrated circuit device recited in claim 19, wherein said first voltage is negative.

22. The layout of the high voltage integrated circuit device recited in claim 19, wherein said first voltage is ground.

23. The layout of the high voltage integrated circuit device recited in claim 19, wherein said second voltage is at least 1 volt below said first voltage.

24. The layout of the high voltage integrated circuit device recited in claim 23, wherein said first voltage is positive.

25. The layout of the high voltage integrated circuit device recited in claim 23, wherein said first voltage is negative.

26. The layout of the high voltage integrated circuit device recited in claim 23, wherein said first voltage is ground.

27. The layout of the high voltage integrated circuit device recited in claim 23, wherein said transistors having a breakdown voltage and the maximum difference between said first voltage and said second voltage is equal to the absolute value of the breakdown voltage of said transistors.

28. The layout of the high voltage integrated circuit device recited in claim 27, wherein said first voltage is positive.

29. The layout of the high voltage integrated circuit device recited in claim 27, wherein said first voltage is negative.

30. The layout of the high voltage integrated circuit device recited in claim 27, wherein said first voltage is ground.

31. The layout of the high voltage integrated circuit device recited in claim 19, wherein said transistors having a breakdown voltage and the maximum difference between said first voltage and said second voltage is equal to the absolute value of the breakdown voltage of said transistors.

32. The layout of the high voltage integrated circuit device recited in claim 31, wherein said first voltage is positive.

33. The layout of the high voltage integrated circuit device recited in claim 31, wherein said first voltage is negative.

34. The layout of the high voltage integrated circuit device recited in claim 31, wherein said first voltage is ground.

* * * * *